(12) United States Patent
Ookawa et al.

(10) Patent No.: US 9,375,871 B2
(45) Date of Patent: Jun. 28, 2016

(54) IMPRINT PROCESS, AND TRANSFER SUBSTRATE AND ADHESIVE USED THEREWITH

(75) Inventors: Yasuhiro Ookawa, Tokyo (JP); Akiko Amano, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 13/880,507

(22) PCT Filed: Oct. 7, 2011

(86) PCT No.: PCT/JP2011/073751
§ 371 (c)(1),
(2), (4) Date: Jun. 21, 2013

(87) PCT Pub. No.: WO2012/053458
PCT Pub. Date: Apr. 26, 2012

(65) Prior Publication Data
US 2013/0270741 A1 Oct. 17, 2013

(30) Foreign Application Priority Data

Oct. 21, 2010 (JP) ................. 2010-236181

(51) Int. Cl.
*B29C 59/00* (2006.01)
*B82Y 10/00* (2011.01)
*B82Y 40/00* (2011.01)
*G03F 7/00* (2006.01)

(52) U.S. Cl.
CPC ............. *B29C 59/005* (2013.01); *B82Y 10/00* (2013.01); *B82Y 40/00* (2013.01); *G03F 7/0002* (2013.01)

(58) Field of Classification Search
CPC ............ B29C 59/005; B29C 2059/023; B29C 2059/027; B29C 35/0888; B29C 35/0805; B28B 11/08; G03F 7/0002; B82Y 40/00; C08J 7/02
USPC .................. 264/293, 299, 496, 232–233, 341
See application file for complete search history.

(56) References Cited

U.S. PATENT DOCUMENTS 5,908,530 A * 6/1999 Hoshizaki et al. ....... 156/345.14
2003/0017657 A1 * 1/2003 Han ................... H01L 21/28273
438/149

(Continued)

FOREIGN PATENT DOCUMENTS

JP          A-7-25907          1/1995
JP          A-2006-255811      9/2006

(Continued)

OTHER PUBLICATIONS

M.R. Oliver; Chemical-Mechanical Planarization of Semiconductor Materials; 2004;Springer-Verlag Berlin Heidelberg; p. 8.*

(Continued)

*Primary Examiner* — Yogendra Gupta
*Assistant Examiner* — Ninh Le
(74) *Attorney, Agent, or Firm* — Oliff PLC (57) ABSTRACT

The imprint process of the invention includes at least an adhesion layer-formation step, a filling step, a curing step, and a releasing step. In the adhesion layer-formation step, an adhesive including a compound including in one molecule a tetravalent atom having one hydrolysable group and two inert group, and a reactive functional group bonded to the atom is brought into contact with a substrate blank that is then scrubbed thereby forming an adhesion layer on the substrate blank to prepare a transfer substrate. In the filling step, a mold is located in proximity to the transfer substrate with a work-material interleaved between the mold and the adhesion layer to fill the work-material up in a transfer shape area of the mold; in the curing step, the work-material is cured; and in the releasing step, the mold is released off from the work-material.

14 Claims, 3 Drawing Sheets

(56) References Cited

U.S. PATENT DOCUMENTS

| | | | |
|---|---|---|---|
| 2003/0162481 A1* | 8/2003 | Antonell | C09G 1/02 451/41 |
| 2007/0017631 A1 | 1/2007 | Xu | |
| 2007/0021520 A1 | 1/2007 | Xu | |
| 2007/0087537 A1* | 4/2007 | Kadoshima | H01L 21/28052 438/585 |
| 2007/0190200 A1* | 8/2007 | Cherala et al. | 425/385 |
| 2007/0212494 A1* | 9/2007 | Xu et al. | 427/401 |
| 2008/0087636 A1* | 4/2008 | Wu et al. | 216/44 |
| 2009/0054673 A1 | 2/2009 | Tsuchida et al. | |
| 2009/0155583 A1 | 6/2009 | Xu et al. | |
| 2009/0325323 A1* | 12/2009 | Ueno et al. | 438/10 |
| 2010/0021577 A1* | 1/2010 | Stewart et al. | 425/3 |
| 2010/0052216 A1* | 3/2010 | Kim et al. | 264/284 |
| 2010/0252103 A1* | 10/2010 | Yao et al. | 136/256 |

FOREIGN PATENT DOCUMENTS

| | | |
|---|---|---|
| JP | A-2007-144995 | 6/2007 |
| JP | A-2008-100378 | 5/2008 |
| JP | B2-4154595 | 9/2008 |
| JP | A-2009-16000 | 1/2009 |
| JP | A-2009-067778 | 4/2009 |
| JP | A-2010-526426 | 7/2010 |
| WO | WO 2011/013630 A1 | 2/2011 |

OTHER PUBLICATIONS

Dec. 27, 2011 International Search Report issued in International Patent Application No. PCT/JP2011/073751 (with translation).

Jan. 20, 2013 International Preliminary Report on Patentability issued in International Patent Application No. PCT/JP2011/073751 (with translation).

* cited by examiner

IMPRINT PROCESS, AND TRANSFER SUBSTRATE AND ADHESIVE USED THEREWITH

ART FIELD

The present invention relates to an imprint process for transferring and forming the desired patterns (that are defined by lines, graphics, etc., including flat surfaces), and a transfer substrate and adhesive used therewith.

BACKGROUND ART

In recent years, attention has been focused on imprint technologies for microprocessing or nanoprocessing. Imprint processes are represented by a pattern formation technique using a mold (mold member) having a micro- or nano-relief structure formed on the surface of a substrate, wherein the relief structure is transferred onto a work-material thereby achieving one-to-one transfer of the micro- or nano-structure.

A photoimprint process has been known as one of such imprint processes. According to this photoimprint process, for instance, a photocurable resin layer is formed as a work-material on an imprinting transfer substrate, and a mold (mold member) having any desired relief structure is pressed against the resin layer. In this state, the resin layer is irradiated with ultraviolet radiation from the mold side for curing, after which the mold is released off from the resin layer, whereby the relief structure that is an inversion of the relief structure that the mold has may be formed on the resin layer that is the work-material. Such a photoimprint process makes it possible to form a nanometer-order pattern that has hardly been provided with conventional photolithography, so it would offer a promising option for the next-generation lithography.

For such an imprint process, it is required to prevent the resin layer from adhering to the surface of the mold as the mold is released off from the cured resin layer. For prevention of such adherence, there have been some methods proposed, including a method in which release treatment is applied to the surface of the mold (Patent Publication 1), a method in which an adhesion layer is interleaved between the imprinting transfer substrate and the cured resin layer to improve adhesion between both (Patent Publications 2 and 3), and a method in which a photocatalytically active substance film provided on the surface of the mold is irradiated with ultraviolet radiation to improve the ability of the mold to be released off from the cured resin layer (Patent Publication 4).

LISTING OF THE PRIOR ART

Patent Publications

Patent Publication 1: U.S. Pat. No. 4,154,595
Patent Publication 2: JP(A) 2009-16000
Patent Publication 3: Japanese Translation of PCT International Application Publication No. 2010-526426
Patent Publication 4: JP(A) 2007-144995

SUMMARY OF THE INVENTION

Problem to be Solved by the Invention

Referring to the aforesaid methods for preventing adherence of the resin layer to the mold in general, and the method for improving adhesion between the imprinting transfer substrate and the cured resin layer in particular, the adhesion layer is formed using a material including such a functional group as forming a bond with the imprinting transfer substrate and such a functional group as forming a bond with the resin layer. Such materials typically include a silane coupling agent. Now that the more the points of reaction with the transfer substrate, the more they work in favor of adhesion improvements, a silane coupling agent in which three functional groups giving access to a bond with the transfer substrate are bonded to a silicon atom is now preferably used.

However, a problem with the conventional adherence-prevention method using such a silane coupling agent is that as the mold is released off from the cured resin layer, it often causes a part of the resin to remain deposited to the mold, ending up with transfer defects and making it impossible to implement stable pattern formation. Another problem is that it is likely to degrade by reason of hydrolysis reaction with atmospheric moisture. This would in turn make long-term storage difficult, get production step management complicated, and offer an obstacle to cutting down pattern-formation cost. Yet another problem is that as the silane coupling agent is coated on the transfer substrate by means of spin coating to form an adhesion layer, it causes the adhesion layer to become thick at the ends or stepped sites of the transfer substrate, resulting in the inability to implement pattern formation with high accuracy.

Taking into account such situations as described above, the present invention has for its objects to provide an imprint process that prevents transfer defects from occurring as the resin layer is released off from the mold, and a transfer substrate and adhesive used to enable such an imprint process.

Means for Solving the Problem

The inventors have arrived at the invention through the discovery that a chain or network layer more likely occur via intermolecular condensation reactions of the silane coupling agent than via bonding reactions of the silane coupling agent with the transfer substrate, and there are bumps formed on the surface of an adhesion layer formed using a silane coupling agent in which three functional groups giving access to a bond with the transfer substrate are bonded to a silicon atom, resulting in a lowering of flatness.

To accomplish such objects as described above, the invention provides an imprint process for transferring a shape of a desired transfer shape area that a mold has onto a work-material while said work-material is interleaved between said mold and a transfer substrate, which comprises an adhesion layer-formation step of forming an adhesion layer on a substrate blank to form a transfer substrate, a filling step of filling said work-material up in said transfer shape area while said mold is brought in proximity to said transfer substrate with said work-material interleaved between said mold and said adhesion layer, a curing step of curing said work-material, and a releasing step of releasing said mold off from said work-material, wherein in said adhesion layer-formation step, an adhesive comprising a compound including in one molecule a tetravalent atom having one hydrolysable group and two inert groups, and a reactive functional group bonded to said atom is brought into contact with said substrate blank, followed by scrubbing in a scrubbing step.

In another embodiment of the invention, the scrubbing in said adhesion layer-formation step is carried out using a polar solvent.

In yet another embodiment of the invention, said tetravalent atom in said adhesive is silicon.

The invention provides an imprinting transfer substrate comprising a substrate blank and an adhesion layer positioned on said substrate blank, wherein said adhesion layer includes a tetravalent atom bonded to said substrate via an oxygen atom and having two inert groups, and a reactive functional group bonded to said atom.

In another embodiment of the invention, adjacent said tetravalent atoms are not bonded together.

In yet another embodiment of the invention, said tetravalent atom is silicon.

The adhesive of the invention is an adhesive for forming an adhesion layer on a transfer sheet used with an imprint process, said adhesive comprising a compound including in one molecule a tetravalent atom having one hydrolysable group and two inert groups, and a reactive functional group bonded to said atom.

In another embodiment of the invention, the above compound may be represented by the following formula (1).

(1)

In the above formula (1), R is a hydrolysable group and stands for an alkoxy group, $X^1$ and $X^2$ that may be identical or different are an inert group and stand for an alkyl group, Y is a reactive functional group and stands for a group selected from the group consisting of an amino group, an epoxy group, a mercapto group, a sulfide group, an acyl group, an isocyanate group, and an unsaturated hydrocarbon group, and n stands for an integer of 1 to 10.

In yet another embodiment of the invention, the compound may be represented by the following formula (2).

(2)

In the above formula (2), $X^3$, $X^4$, $X^5$ and $X^6$ that may be identical or different are an inert group and stand for an alkyl group, $Y^1$ and $Y^2$ that may be identical or different are a reactive functional group and stand for a group selected from the group consisting of an amino group, an epoxy group, a mercapto group, a sulfide group, an acyl group, an isocyanate group, and an unsaturated hydrocarbon group, and $n_1$ and $n_2$ that may be identical or different stand for an integer of 1 to 10.

Advantages of the Invention

In the inventive imprint process, the tetravalent atom that forms a part of the adhesive used in the adhesion layer-formation step has only one hydrolysable group. After this hydrolysable group undergoes hydrolysis, it bonds with the point of reaction on the surface of the substrate where a hydroxyl group is present (going through a hydrogen bond and forming a covalent bond via an oxygen atom) and the tetravalent atom has two inert groups, so that the tetravalent atom bonded to the surface of the substrate is kept against making bonds with the tetravalent atoms of other molecules.

In addition, a portion of the adhesive remaining unreacted with the substrate is scrubbed off, so that there is no unnecessary adhesive remaining just only at the ends of the substrate but also in stepped sites on the surface of the substrate, making sure the formation of the transfer substrate having an adhesion layer of uniform thickness. In the following filling and curing steps, this ensures that the reactive functional group of the adhesion layer reacts with the work-material to form a bond with it, making sure the cured work-material is in reliable contact with the transfer substrate via the adhesion layer. Consequently, transfer defects that may otherwise be caused by deposition of the work-material to the mold could be prevented in the releasing step.

The inventive transfer substrate comprises an adhesion layer that includes a tetravalent atom that is bonded to the substrate via an oxygen atom and has two inert groups, and a reactive functional group bonded to said atom. Such an adhesion layer has an improved flatness, ensuring that, during imprint, the work-material located on the adhesion layer is reliably held in place through reactions with the reactive functional groups positioned on the surface of the adhesion layer, making sure prevention of a releasing of the work-material together with the mold as the mold is released off.

The inventive adhesive comprises the compound including in one molecule the tetravalent atom having one hydrolysable group and two inert groups, and a reactive functional group bonded to said atom. By hydrolysis of the hydrolysable group, the tetravalent atom migrates to the surface of the substrate via a hydrogen bond with the hydroxyl group on the surface of the substrate, and further undergoes dehydration and condensation reactions, yielding a strong covalent bond with the surface of the substrate. The tetravalent atom bonded to the surface of the substrate in this way, because of having two inert groups, is well kept against forming bonds with tetravalent atoms of other molecules via condensation reactions, resulting in prevention of aggregation of the adhesive. For instance, even though a portion of the adhesive remaining unreacted with the substrate yields dimers, it may be scrubbed off because it is not bonded to the tetravalent atom bonded to the surface of the substrate, thereby making it possible to form the adhesion layer of uniform thickness. The inventive adhesive is superior in storage stability to a silane coupling agent whose silicon includes a plurality of hydrolysable groups.

EMBODIMENTS FOR CARRYING OUT THE INVENTION

Specific embodiments of the invention will now be explained with reference to the accompanying drawings.

[Imprinting Transfer Substrate]

Figure 1:
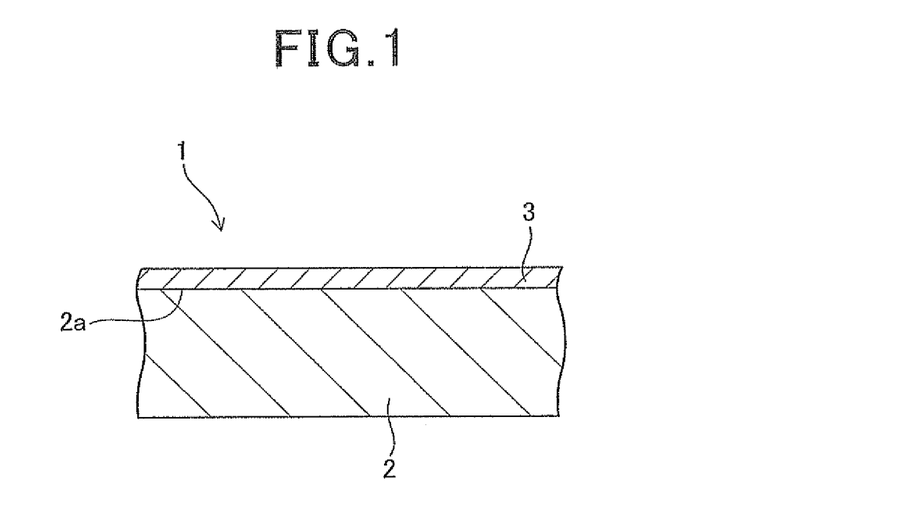
FIG. 1 is a fragmentary sectional view of one embodiment of the inventive transfer substrate.

FIG. 1 is a fragmentary sectional view of one specific embodiment of the transfer substrate according to the invention. As depicted in FIG. 1, a transfer substrate indicated generally by 1 comprises a substrate blank 2 and an adhesion layer 3 positioned on one surface 2a of the substrate blank 2.

The substrate blank 2 forming a part of the transfer substrate 1, for instance, may be made up of glasses such as quartz glass, soda lime glass, and borosilicate glass, semiconductors such as silicon or silicon oxide, silicon nitride, gallium arsenide, and gallium nitride, metals such as chromium, tantalum, aluminum, nickel, titanium, copper, iron, and cobalt, or composite materials comprising any desired combinations of these materials. The substrate blank 2 may have a desired pattern structure on the surface 2a side. Non-limiting examples of this pattern structure include micro- or nano-order circuitry used on semiconductors, displays or the like, photonic crystal structures, light guides, and holographic or other optical structures.

Figure 2:
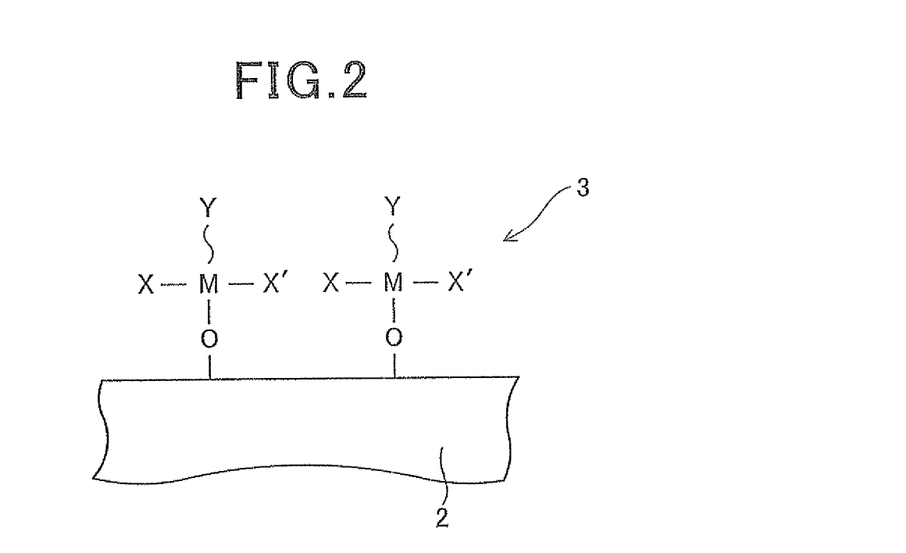
FIG. 2 is illustrative of the molecular structure of the adhesion layer that forms a part of the inventive imprinting transfer substrate.

The adhesion layer 3 that forms a part of the transfer substrate 1 includes a tetravalent atom that is bonded to the substrate blank 2 via an oxygen atom and has two inert groups, and a reactive functional group bonded to this atom. FIG. 2 is provided to illustrate the molecular structure of such adhesion layer 3. As depicted in FIG. 2, the tetravalent atom M is bonded to the substrate blank 2 via the oxygen atom O, and has two inert groups X and X'. There is also the reactive functional group Y bonded to the tetravalent atom M. And the adjacent tetravalent atoms M are not bonded to each other; so there would be a monomolecular structure in the absence of a chain or network layer that is otherwise formed by condensation reactions between the molecules forming the adhesion layer 3.

The tetravalent atom M forming a part of the adhesion layer 3 may be silicon, titanium, etc. among which silicon is preferred. The inert groups X and X' do not undergo hydrolysis, and may be identical or different alkyl groups such as methyl, ethyl, n-propyl, isopropyl, n-butyl, isobutyl, sec-butyl, tert-butyl, and benzyl groups. The reactive functional group Y reacts with an organic component that is the work-material, and is selected from the group consisting of, for instance, an amino group, an epoxy group, a mercapto group, a sulfide group, an acyl group, an isocyanate group, and an unsaturated hydrocarbon group that is bonded to the tetravalent atom M via an atomic bonding —$(CH_2)_n$—. The unsaturated hydrocarbon group here may be a vinyl group, a methacryl group, an acryloxy group, a metacryloxy group, etc. The small letter n in the atomic bonding is an integer of 1 to 10, but n is preferably between 1 and 3, because the molecules that form the adhesion layer should preferably have a low molecular weight so as to make the molecular density distribution more uniform.

Such inventive transfer substrate 1 has an improved surface flatness because of the absence of any heterogeneous layer like a chain or network layer that is otherwise formed by condensation reactions between the molecules forming the adhesion layer 3. The adhesion layer 3, because there is none of a chain or network layer structure, is so less likely to absorb foreign matter that the heterogeneousness or micro- or nano-bumps due to foreign matter of the adhesion layer attributable to work-material defects during releasing can be reduced, resulting in prevention of transfer defects. The tetravalent atom M bonded to the surface of the substrate blank 2 is kept against being bonded to other tetravalent atoms of other molecules, which makes sure it is in close contact with the surface of the substrate blank 2 with higher density. This in turn enables the work-material located on the adhesion layer 3 to be more reliably bonded and held in place during imprinting by reactions with the reactive functional group Y positioned on the surface of the adhesion layer 3.

It is here to be noted that the specific embodiment of the aforesaid imprinting transfer substrate is provided only by way of example, so the invention is not limited to it.

[Adhesive]

To form such adhesion layer 3 of the transfer substrate 1, use may be made of the inventive adhesive comprising a specific compound including in one molecule a tetravalent atom having one hydrolysable group and two inert groups, and a reactive function group bonded to this atom. In what follows, the inventive adhesive will be explained.

As described above, the inventive adhesive comprises a compound including in one molecule a tetravalent atom having one hydrolysable group and two inert groups, and a reactive functional group bonded to said atom. One example of such a compound may be represented by the following formula (1) wherein the tetravalent atom is silicon.

(1)

In the above formula (1), R is a hydrolysable group and stands for an alkoxy group, $X^1$ and $X^2$ that may be identical or different are an inert group and stand for an alkyl group, Y is a reactive functional group and stands for a group selected from the group consisting of an amino group, an epoxy group, a mercapto group, a sulfide group, an acyl group, an isocyanate group, and an unsaturated hydrocarbon group, and n stands for an integer of 1 to 10.

The alkoxy group R here, for instance, may be a methoxy group, an ethoxy group, a propoxy group, a butoxy group, an isopropoxy group, and a cyclohexyloxy group. The alkyl groups $X^1$ and $X^2$ here, for instance, may be a methyl group, an ethyl group, a n-propyl group, an isopropyl group, a n-butyl group, an isobutyl group, a sec-butyl group, a tert-butyl group, and a benzyl group, and the unsaturated hydrocarbon group here, for instance, may be a vinyl group, a methacryl group, an acryloxy group, and a methacryloxy group.

The reactive functional group Y may optionally be selected while taking into account the organic component that is the work-material: for instance when the work-material is an organic component containing an acid, an ester, an epoxy, a ketone, and a halogenide, the amino group may be selected as the reactive functional group Y; when the work-material is an organic component containing an amino group or a carboxyl group, the epoxy group may be chosen as the reactive functional group Y; when the work-material is an organic component containing a thiol, the mercapto group may be picked up as the reactive functional group Y; and when the work-material is an organic component containing an acryl monomer, the unsaturated hydrocarbon group may be selected as the reactive functional group Y.

Examples of the compound represented by the above formula (1) are (3-acryloxymethyl)dimethylmethoxysilane, (3-acryloxyethyl)dimethylmethoxysilane, (3-acryloxy-propyl)dimethylmethoxysilane, (3-methacryloxymethyl)dimethylmethoxysilane, (3-methacryloxyethyl)dimethylmethoxysilane, and (3-methacryloxypropyl)dimethylmethoxysilane. To make the molecular density distribution of the formed adhesion layer more uniform, the compound represented by the above formula (1) should preferably have a low molecular weight with reductions of steric hindrance, etc. in mind, and preference is given to a compound containing a methoxy or ethoxy group as the alkoxy group R and a methyl, ethyl or propyl group as the alkyl groups $X^1$ and $X^2$ with n being 1 to 3.

Another example of the compound forming the inventive adhesive is a disilazane compound represented by the following formula (2) wherein the tetravalent atom is silicon and one hydrolysable group (>NH) is shared by two silicon atoms.

(2)

In the above formula (2), $X^3$, $X^4$, $X^5$ and $X^6$ that may be identical or different are an inert group and stand for an alkyl group, $Y^1$ and $Y^2$ that may be identical or different are a reactive functional group and stand for a group selected from the group consisting of an amino group, an epoxy group, a mercapto group, a sulfide group, an acyl group, an isocyanate group, and an unsaturated hydrocarbon group, and $n^1$ and $n^2$ that may be identical or different stand for an integer of 1 to 10.

The alkyl groups $X^3$, $X^4$, $X^5$ and $X^6$ here, for instance, may be a methyl group, an ethyl group, a n-propyl group, an isopropyl group, a n-butyl group, an isobutyl group, a sec-butyl group, a tert-butyl group, and a benzyl group, and the unsaturated hydrocarbon group here, for instance, may be a vinyl group, a methacryl group, an acryloxy group, and a methacryloxy group.

The reactive functional groups $Y^1$ and $Y^2$ may optionally be selected while taking into account the organic component that is the work-material: for instance when the work-material is an organic component containing an acid, an ester, an epoxy, a ketone, and a halogenide, the amino group may be selected as the reactive functional group $Y^1$ and $Y^2$; when the work-material is an organic component containing an amino group or a carboxyl group, the epoxy group may be chosen as the reactive functional group $Y^1$ and $Y^2$; when the work-material is an organic component containing a thiol, the mercapto group may be picked up as the reactive functional group $Y^1$ and $Y^2$; and when the work-material is an organic component containing an acryl monomer, the unsaturated hydrocarbon group may be selected as the reactive functional group $Y^1$ and $Y^2$.

Examples of the compound represented by the above formula (2) are 1,3-bis(3-acryloxymethyl)tetramethyl-disilazane, 1,3-bis(3-acryloxymethyl)tetraethyldisilazane, 3-bis(3-acryloxymethyl)tetrapropyldisilazane, 1,3-bis(3-acryloxyethyl)tetramethyldisilazane, 1,3-bis(3-acryloxyethyl)tetraethyldisilazane, 1,3-bis(3-acryloxyethyl)tetrapropyldisilazane, 1,3-bis(3-acryloxypropyl)tetramethyldisilazane, 1,3-bis(3-acryloxypropyl)tetraethyldisilazane, and 1,3-bis(3-acryloxypropyl)tetrapropyldisilazane. To make the molecular density distribution of the formed adhesion layer more uniform, the compound represented by the above formula (2) should preferably have a low molecular weight with reductions of steric hindrance, etc. in mind, and preference is given to a compound containing a methyl or ethyl group as the alkyl groups $X^3$, $X^4$, $X^5$ and $X^6$ with $n_1$ and $n_2$ being from 1 to 3.

Together with such compounds as described above, the inventive adhesive may contain solvents such as methyl alcohol, ethyl alcohol, isopropyl alcohol, xylene, acetone, ethyl acetate, tetrahydrofuran, methyl ethyl ketone, methyl isobutyl ketone, and methyl cellosolve, as required.

With such an inventive adhesive, hydrolysis of the hydrolysable groups causes the tetravalent atoms to migrate onto the substrate surface via hydrogen bonds with hydroxyl groups on the substrate surface, further going through dehydration and condensation reactions to form strong covalent bonds with the substrate surface. And the tetravalent atoms thus bonded to the substrate surface, because of having two inert groups, are kept from bonding with the tetravalent atoms of other molecules via condensation reactions, ending up with prevention of aggregation of the adhesive. A portion of the adhesive remaining unreacted with the substrate may be scrubbed off because of not bonding with the tetravalent atoms bonded to the substrate surface, even though it yields dimers as an example. This could then make sure formation of the adhesion layer having uniform thickness. The inventive adhesive is also less susceptible of hydrolysis, and better in storage stability, than a silane coupling agent whose silicon has a plurality of hydrolysable groups.

It is here to be noted that the above adhesive embodiment is provided by way of example alone: the present invention is not limited to it. For instance, the tetravalent atom may be titanium or the like.

[Imprint Process]

In what follows, the inventive imprint process will be explained.

The inventive imprint process comprises interleaving a work-material between the mold having a transfer shape area having the desired shape and the transfer substrate for transferring the shape of the transfer shape area onto the work-material.

FIGS. 3A to 3E are illustrative of the process steps of one embodiment according to the invention.

Figure 3A:
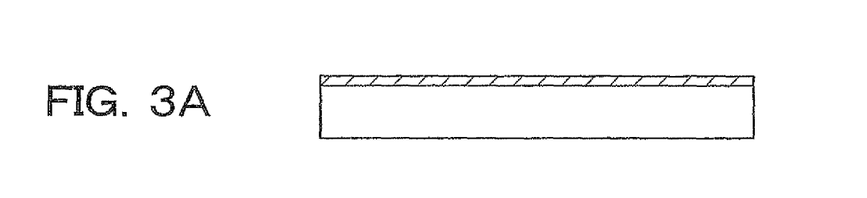
FIGS. 3A to 3E are illustrative of the process steps of one embodiment of the inventive imprint process.
Figure 3B:
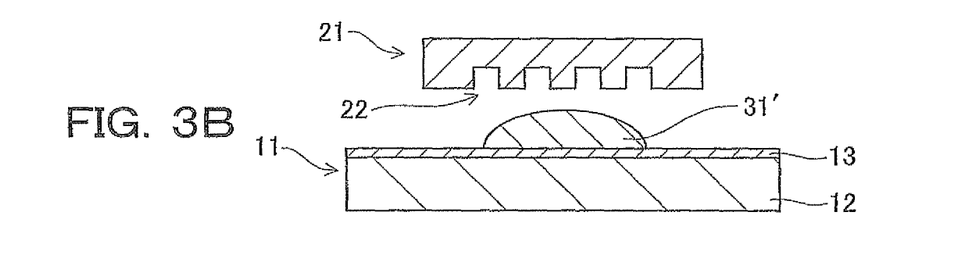

In the invention, an adhesion layer 13 is formed on a substrate blank 12 to form a transfer substrate 11 in the adhesion layer-formation step (FIG. 3A). The substrate blank 12 used here may be the same as the substrate blank 2 forming a part of the inventive transfer substrate 1 as described above. The adhesion layer 13 may be formed by bringing the adhesive in contact with the substrate blank 12, wherein said adhesive comprises the compound including in one molecule a tetravalent atom having one hydrolysable group and two inert groups, and a reactive functional group bonded to said atom, followed by scrubbing.

Contact of the adhesive with the substrate blank 12, for instance, may be achieved by means of a chemical evaporation process or a wet process. The wet process here, for instance, may include a spin coating process, a dip coating process, and a dipping process. Such a wet process is preferable because of its simplified feature.

Through hydrolysis of one hydrolysable group bonded to the tetravalent atom, the adhesive in contact with the substrate blank 12 bonds with the point of reaction on the surface of the substrate blank 12 where there is a hydroxyl group (going through a hydrogen bond and forming a covalent bond via an oxygen atom). The tetravalent atom bonded to the surface of the substrate blank 12, because of having two inert groups, is kept from undergoing condensation reactions with the tetravalent atoms of other molecules. Consequently, a portion of the adhesive remaining unreacted with the substrate blank may be scrubbed off because of being not bonded to the tetravalent atom bonded to the surface of the substrate blank 12, even though it yields diners as an example. As shown typically in FIG. 4, this may prevent the thickness of the adhesion layer from increasing in a stepped site 12A on the substrate blank 12 (a risen site indicated by a chain line in FIG. 4) due to an unnecessary portion of the adhesive, making sure the adhesion layer 13 of uniform thickness, on the surface of which the reactive functional groups are positioned. Scrubbing for removal of the portion of the adhesive remaining unreacted with the substrate blank 12 may be implemented using a polar solvent such as methyl alcohol, ethyl alcohol, isopropyl alcohol, benzene, toluene, xylene, acetone, ethyl acetate, tetrahydrofuran, methyl ethyl ketone, methyl isobutyl ketone, and methyl cellosolve, and by means of a spin coating process, a dip coating process, a dipping process or the like. Note here that before or after contact with the adhesive, the substrate blank 12 may be heated for accelerated reaction of the adhesive with the substrate blank 12.

The adhesive used in such an adhesion layer-formation step may be the inventive one as described above.

Figure 3C:
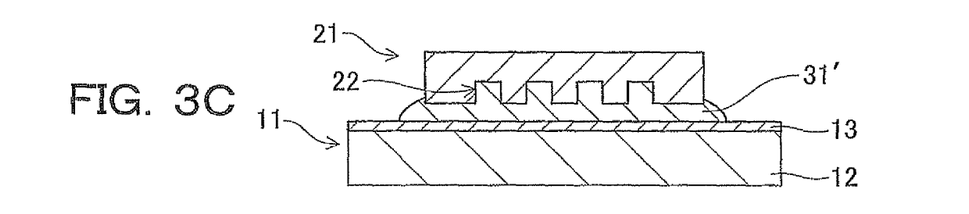

Then, in the filling step, a work-material 31' is fed onto the adhesion layer 13 of the transfer substrate 11 (FIG. 3B), and a mold 21 having a transfer shape area 22 is brought in proximity to the transfer substrate 11 in such a way that the work-material 31' is interleaved between the mold 21 and the adhesion layer 13 to fill the work-material 31' up in the transfer shape area 22 of the mold 21 (FIG. 3C). Note here that the filling of the work-material 31' in the transfer shape area 22 of the mold 21 may be implemented by feeding the work-material 31' onto the mold 21, and pressing the adhesion layer 13 of the transfer substrate 11 against the work-material 31'.

When the work-material 31' is a photocurable resin, the mold 21 may be formed of a transparent material capable of being transparent to irradiation light for curing the work-material 31'. For instance, it may be formed of quartz glass, silicate glass, calcium fluoride, magnesium fluoride, and acryl glass or any desired laminate of these materials. The transfer shape area 22 the mold 21 has is shown to have a relief structure having recesses, but the invention is not limited to it: the transfer shape area 22 may have any desired shape and size. Alternatively, the mold 21 used may have a so-called mesa structure wherein a site where the transfer shape area 22 is positioned has a convex structure with respect to the surrounding.

Figure 3D:
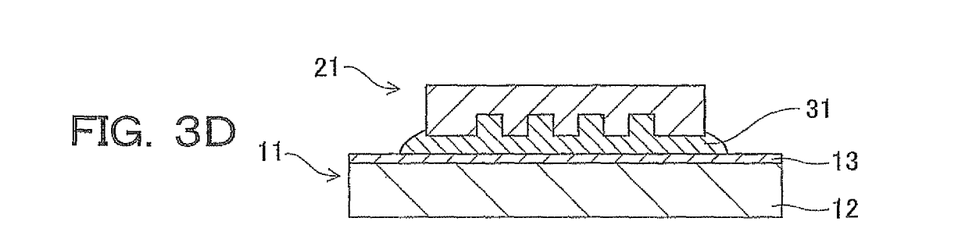

Then, in the curing step, the work-material 31' interleaved between the transfer substrate 11 and the mold 21 is cured into a work-material 31 (FIG. 3D). This work-material 31 reacts with, and is bonded to, the reactive functional groups positioned on the surface of the adhesion layer 13, ensuring that it is reliably held by the adhesion layer 13. In such a curing step, when the work-material 31' is a photocurable resin, it may be irradiated with light from the side of the mold 21 for curing. When the transfer substrate 11 is transparent to irradiation light, on the other hand, the work-material 31' may be irradiated with light from the side of the transfer substrate 11 for curing.

Figure 3E:
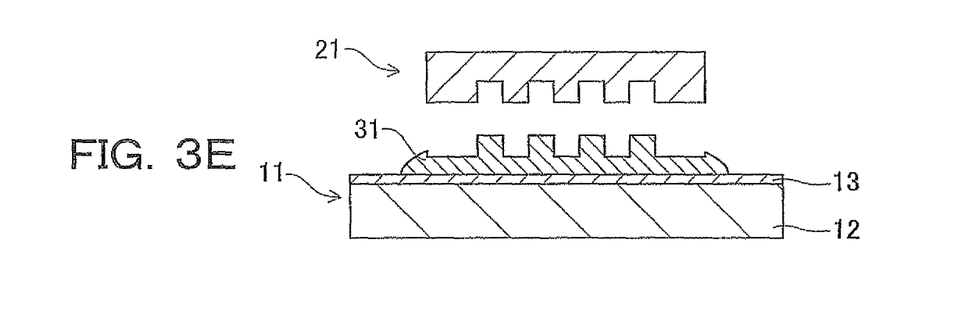

Then, in the releasing step, the mold 21 is released off from the work-material 31 (FIG. 3E). This in turn causes the work-material 31 to be patterned (the transfer shape area 22 of the mold 21 to be transferred onto the work-material 31). In the invention, the work-material 31 is reliably held by the substrate blank 12 of the transfer substrate 11 via the adhesion layer 13, so that transfer defects that may otherwise be caused by the adhesion of the work-material 31 to the mold 21 can be prevented, making it possible to implement high-precision pattern formation.

Although not shown, the above releasing step may be followed by an additional step in which a residual film portion of the work-material 31 is removed together with the adhesion layer 13 positioned below it to expose out the surface of the substrate blank 12, and in this state, the surface of the substrate blank 12 is etched using the work-material 31 remaining in this state as a resist pattern to form a relief structure pattern on the substrate blank 12. In this case, as the adhesion layer 13 has an uneven thickness, the residual film portion of the work-material 31 including the adhesion layer 13 is also going to have an uneven thickness, giving rise to a lowering of the precision of the resist pattern and, hence, resulting in a lowering of the precision of the pattern formed on the substrate blank 12 by etching via the resist pattern. According to the inventive imprint process, the uniform thickness of the adhesion layer makes sure high-precision pattern formation.

In such an inventive imprint process, the adhesive used in the adhesion layer-formation step is less susceptible of hydrolysis, and better in storage stability, than a silane coupling agent whose silicon has a plurality of hydrolysable groups, making control of the process steps easier and the cost of pattern formation lower.

The above embodiment of the above inventive imprint process is provided as an example alone: the invention is not limited thereto whatsoever.

In what follows, the invention will now be explained more specifically with reference to more specific examples.

Example 1

Adhesion Layer-Formation Step

Figure 4:
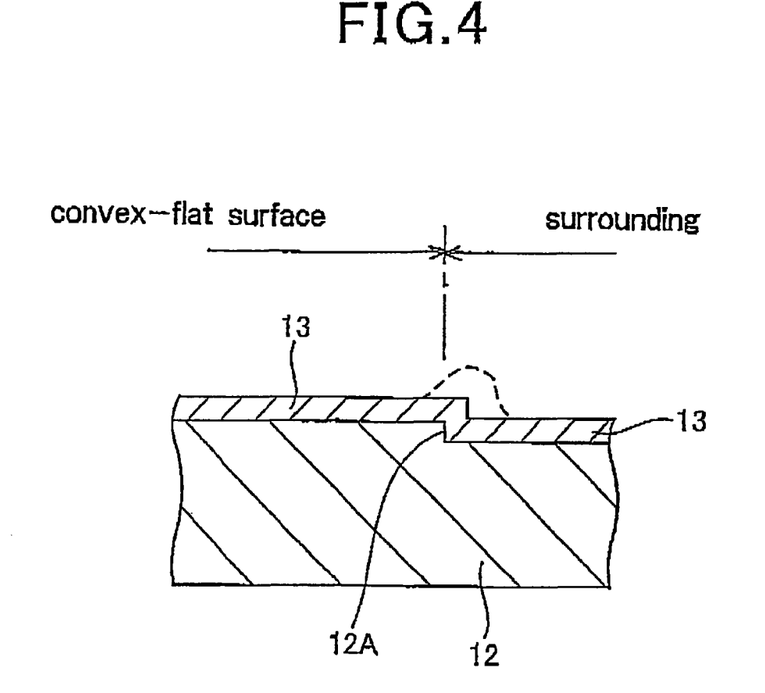
FIG. 4 is illustrative of the thickness of the adhesion layer in a stepped site of the substrate.

A silicon wafer (of 150 mm in diameter) was provided as the substrate blank. This substrate blank had a 26 mm×32 mm convex, flat surface at a middle portion of one surface. The substrate blank had a thickness of 0.625 mm on that convex, flat surface and a step of 0.03 mm between that thickness and a 0.595 mm thickness of the surrounding substrate blank portion, as shown in FIG. 4.

(3-Acryloxypropyl)dimethylmethoxysilane (made by Gelest Co., Ltd.) was provided as Adhesive A. This Adhesive A was measured for $^1$H-NMR and $^{29}$Si-NMR changes over time by means of NMR spectroscopy under the following conditions to determine the degrees of hydrolysis and dehydration/condensation occurring in the adhesive over time and make an estimation of storage stability. The results are tabulated in Table 1 given later.

(Measuring Conditions for NMR Spectroscopy)

JNM-LA400WB made by JEOL Ltd. was used to measure $^1$H-NMR and $^{29}$Si-NMR thereby analyzing the reaction process of condensation of the silane coupling agent. The resonance frequencies were set at 400 MHz and 79.3 MHz, and tetramethylsilane was used as an external reference.

(Criteria for Estimation of Storage Stability)

Mark ○ indicates that one month after unsealing of the adhesive container, no methanol was formed: good storage stability, and Mark X indicates that one month after unsealing of the adhesive container, methanol was formed: poor storage stability.

The above Adhesive A was coated on, and brought in contact with, the convex, flat surface side of the substrate blank by means of a spin coating process, after which the adhesive-coated surface of the substrate blank was scrubbed by means of a spin coating process using isopropyl alcohol as a scrubber. Thereafter, the substrate blank was heated to 80° C. and held there for 10 minutes to prepare a transfer substrate including an adhesion layer on the convex, flat surface.

The angle-of-contact changes over time were measured under the following conditions to determine the degrees of surface deteriorations occurring in the formed adhesion layer and make an estimation of storage stability. The results are tabulated in Table 1 given later.

(Measuring Conditions for the Angle of Contact)

Water was added dropwise onto the adhesion layer from a microsyringe, and after the lapse of 10 seconds, the angle of contact of the adhesion layer with water was measured using DM-700 Model made by Kyowa Interface Science Co., Ltd.)

(Criteria for Estimation of Storage Stability)

Mark ○ indicates that one week after formation of the adhesion layer, the angle-of-contact change was less than 2°: good storage stability, and Mark X indicates that one week after formation of the adhesion layer, the angle-of-contact change was more than 2°: poor storage stability.

Whether or not there were bumps formed on the adhesion layer of the prepared transfer substrate (that would appeared to occur due to the aggregation of the adhesive) was observed and estimated by means of an atomic force microscope (AFM) under the following conditions. The results are tabulated in Table 1 given later.

(Conditions for the Atomic Force Microscopy Estimation)

An atomic force microscope (L-trace made by SII Nanotechnology Co., Ltd.) was used to measure a 0.03 mm×0.03 mm area of the adhesion layer to make an estimation of whether or not there were bumps of more than 5 nm in height. This is because bumps of more than 5 nm in height could possibly give rise to transfer defects.

(Criteria for Estimation of the Surface of the Adhesion Layer)

Mark ○ indicates that there are none of bumps of more than 5 nm in height, and

Mark X indicates that there are bumps of more than 5 nm in height.

Filling Step

There was a flat mold provided that was formed of a 40 mm×40 mm quartz glass of 6.35 mm in thickness and had no relief structure pattern.

A photocurable resin having the following composition was provided as the work-material that was then fed dropwise onto 5×5 (25 in all) sites on the adhesion layer of the above transfer substrate at a pitch of 0.5 mm. Thereafter, it was placed on the substrate stage of an imprint apparatus. Then, the above mold was forced into the work-material to fill it up in the relief structure of the transfer shape area.

| (Composition of the Photocurable Resin) | |
|---|---|
| Isobornyl acrylate | 38% by weight |
| Ethylene glycol diacrylate | 20% by weight |
| Butyl acrylate | 38% by weight |
| 2-Hydroxy-2-methy-1-phenyl-propan-1-one | 2% by weight |
| 2-Perfluorodecylethyl acrylate | 1% by weight |
| Methylperfluorooctanolate | 1% by weight |

Curing Step

With the work-material, viz. the photocurable resin interleaved between the mold and the transfer substrate, the mold was irradiated with 100 mJ/cm$^2$ of ultraviolet radiation from the lighting system of the imprint apparatus thereby curing the photocurable resin.

Releasing Step

Then, the mold was released off from the cured work-material to form a transfer surface.

Example 2

Example 1 was repeated with the exception that Adhesive B: 1,3-bis(3-acryloxymethyl)tetramethyl-disilazane (made by Shin-Etsu Chemical Co., Ltd.) was used instead of Adhesive A, thereby transferring the flat surface of the mold onto the work-material.

The storage stability of Adhesive B used was estimated as in Example 1, with the results set out in Table 1 given later.

Whether or not there were bumps present on the surface of the adhesion layer of the prepared transfer substrate was observed as in Example 1, with the results set out in Table 1 given later.

Comparative Example 1

Example 1 was repeated with the exception that Adhesive C: (3-acryloxymethyl)trimethoxysilane (made by Gelest Co., Ltd.) was used instead of Adhesive A, thereby transferring the flat surface of the mold onto the work-material.

The storage stability of Adhesive C used was estimated as in Example 1, with the results set out in Table 1 given later.

Whether or not there were bumps present on the surface of the adhesion layer of the prepared transfer substrate was observed as in Example 1, with the results set out in Table 1 given later.

Comparative Example 2

Example 1 was repeated with the exception that the scrubbing operation using the scrubber was not implemented in the adhesion layer-formation step, thereby transferring the flat surface of the mold onto the work-material.

Whether or not there were bumps present on the surface of the adhesion layer of the prepared transfer substrate was observed as in Example 1, with the results set out in Table 1 given later.

TABLE 1

| | | Storage estimation of the adhesive | | |
|---|---|---|---|---|
| | Adhesive | Material state NMR spectroscopy | Adhesion layer after formed into film Measurement of the angle of contact | Adhesion layer Presence or Absence of bumps |
| Example 1 | A | ○ | ○ | ○ |
| Example 2 | B | ○ | ○ | ○ |
| Comparative Example 1 | C | X | ○ | X |
| Comparative Example 2 | A | ○ | ○ | X |

As can be seen from Table 1, it has been determined that the inventive Adhesives A and B excel in storage stability. In Examples 1 and 2, the inventive transfer substrates having the adhesion layers formed using Adhesives A and B are found to have no bumps on the surfaces of the adhesion layers, and have no risen portions in the stepped sites on the substrates. This could reveal that any bonds due to condensation reactions are held back between the silicon atoms bonded to the substrate surface and the silicon atoms of other molecules, and the portion of the adhesive remaining unreacted with the substrate is impeccably removed by scrubbing. It has also been confirmed that both the transfer surfaces formed in Examples 1 and 2 are free of any transfer defects, indicating that good patterning (transfer of the flat surface of the mold) has been achieved by the inventive imprint process.

By contrast, Adhesive C had poorer storage stability. It has been confirmed that both the transfer substrate having the adhesion layer prepared using Adhesive C in Comparative Example 1 and the transfer substrate prepared without recourse to scrubbing in Comparative Example 2 have bumps on the surfaces of the adhesion layers.

APPLICABILITY TO THE INDUSTRY

The present invention may find applications to patterning and micro- or nano-processing using imprint technologies.

EXPLANATION OF THE REFERENCE NUMERALS 1, 11: Transfer Substrate
2, 12: Substrate Blank
3, 13: Adhesion Layer
4: Wettability Variable Layer
21: Mold
22: Transfer Shape Area
31': Work-material
31: Cured Work-material

What is claimed is:

1. An imprint process for transferring a shape of a desired transfer shape area that a mold has onto a work-material while said work-material is interleaved between said mold and a transfer substrate blank, comprising:
an adhesion-layer formation step of forming an adhesion layer on said transfer substrate blank to form a transfer substrate,
a filling step of filling said work-material in said transfer shape area while said mold is brought in proximity to said transfer substrate with said work-material interleaved between said mold and said adhesion layer,
a curing step of curing said work-material, and
a releasing step of releasing said mold off from said work-material, wherein in said adhesion-layer formation step, an adhesive containing a plurality of monomolecular structures each comprising a single tetravalent atom having one hydrolysable group and two inert groups and a reactive functional group bonded to said tetravalent atom is brought into contact with said substrate blank, followed by an adhesive removal step of removing a portion of the adhesive remaining unreacted with the substrate blank, thereby forming an adhesion layer having no bumps of more than 5 nm in height.

2. The imprint process as recited in claim 1, wherein the adhesive removal step in said adhesion layer-formation step uses a polar solvent.

3. The imprint process as recited in claim 1, wherein said tetravalent atom in said adhesive is silicon.

4. The imprint process as recited in claim 1, wherein a portion of the substrate blank having a convex, flat surface having a convex structure with respect to surrounding remainder of the substrate blank is used as said substrate blank, and in said adhesion layer-formation step, the adhesion layer is formed on said convex, flat surface to form a transfer substrate.

5. The imprint process as recited in claim 1, wherein in said adhesion layer-formation step, said adhesive is coated on said substrate blank by a spin coating process.

6. The imprint process as recited in claim 2, wherein said tetravalent atom in said adhesive is silicon.

7. The imprint process as recited in claim 1, wherein the adhesive removal step is performed by at least one process selected from a group consisting of a spin coating process, a dip coating process, and a dipping process.

8. The imprint process as recited in claim 4, wherein the convex, flat surface is flat over an entire surface of the convex, flat surface.

9. An imprinting transfer substrate comprising a substrate blank and an adhesion layer positioned on said substrate blank, wherein said adhesion layer includes a plurality of monomolecular structures each comprising a single tetravalent atom bonded to said substrate blank via an oxygen atom and having two inert groups, and a reactive functional group bonded to said tetravalent atom, and has no bumps of more than 5 nm in height.

10. The transfer substrate as recited in claim 9, wherein adjacent said tetravalent atoms in the plurality of monomolecular structures are not bonded to each other.

11. The transfer substrate as recited in claim 9, wherein said tetravalent atom is silicon.

12. The transfer substrate as recited in claim 9, wherein a portion of said substrate blank has a convex, flat surface having a convex structure with respect to surrounding remainder of the substrate blank, with said adhesion layer formed on said convex, flat surface.

13. The transfer substrate as recited in claim 10, wherein said tetravalent atom is silicon.

14. The transfer substrate as recited in claim 12, wherein the convex, flat surface is flat over an entire surface of the convex, flat surface.

* * * * *